United States Patent [19]

LeBlanc

[11] Patent Number: 4,976,802
[45] Date of Patent: Dec. 11, 1990

[54] PROCESS FOR ASSEMBLING SMALLER SCANNING OR PRINTING ARRAYS TOGETHER TO FORM A LONGER ARRAY

[75] Inventor: Ewart O. LeBlanc, Fairport, N.Y.

[73] Assignee: Xerox Corporation, Stamford, Conn.

[21] Appl. No.: 421,919

[22] Filed: Oct. 16, 1989

[51] Int. Cl.⁵ .................................... B32B 31/00
[52] U.S. Cl. .......................... 756/273.5; 156/273.9; 156/275.5; 156/275.7; 156/295; 156/297; 358/43
[58] Field of Search .............. 156/556, 299, 300, 560, 156/561, 562, 272.2, 275.7, 307.1, 297, 308.4, 275.3, 275.1, 307.7, 273.3, 263, 273.5, 304.3, 304.1, 295, 297, 307.3; 358/43, 44; 437/2; 29/467, 468, 740, 760, 587, 757, 743, 760, 464–465, 559; 346/140 R

[56] References Cited

U.S. PATENT DOCUMENTS

| | | | |
|---|---|---|---|
| 4,321,747 | 3/1982 | Takemura | 437/249 |
| 4,383,018 | 5/1983 | Martin | 156/332 |
| 4,388,128 | 6/1983 | Ogawa et al. | 156/64 |
| 4,523,102 | 6/1985 | Kazufumi et al. | 250/578 |
| 4,661,191 | 4/1987 | Kamio et al. | 156/275.5 |
| 4,698,113 | 10/1987 | Ogawa | 156/275.7 |
| 4,735,671 | 4/1988 | Stoffel | 156/300 |
| 4,814,296 | 3/1989 | Jedlicka et al. | 437/226 |

Primary Examiner—Michael W. Ball
Assistant Examiner—Chester T. Barry
Attorney, Agent, or Firm—Frederick E. McMullen

[57] ABSTRACT

A process for fabricating a full width scanning or printing array in which plural smaller scanning or printing chips are bonded end-to-end onto an glass substrate using a photocurable adhesive to form a subassembly, following which the subassembly is inverted and joined to a second substrate having a conductive surface using a conductive heat activated adhesive.

4 Claims, 4 Drawing Sheets

PROCESS FOR ASSEMBLING SMALLER SCANNING OR PRINTING ARRAYS TOGETHER TO FORM A LONGER ARRAY

The invention relates to a process for fabricating image sensor arrays, and more particularly to an improved process for bonding smaller chips together end-to-end to form long image sensor arrays without sacrifice of image quality.

Image sensor arrays for scanning document images, such as Charge Coupled Devices (CCDs), typically have a row or linear array of photosites together with suitable supporting circuitry integrated onto silicon. Usually, an array of this type is used to scan line by line across the width of a document with the document being moved or stepped lengthwise in synchronism therewith.

In the above application, the image resolution of the array is proportional to the ratio of the scan width and the number of photosites. Because of the difficulty in economically designing and fabricating long arrays, image resolution for the typical array commercially available today is relatively low when the array is used to scan a full line. While resolution may be improved electronically as by interpolating extra image signals, or by interlacing several smaller arrays with one another in a non-colinear fashion so as to crossover from one array to the next as scanning along the line progresses, electronic manipulations of this type adds to both the complexity and the cost of the system. Further, single or multiple array combinations such as described above usually require more complex and expensive optical systems.

A full width array having a length equal to or larger than the document line and with a large packing of co-linear photosites to assure high resolution, has been and remains a very desirable but so far unattainable aim. While forming a full length array by assembling several smaller arrays, referred to as chips herein together end-to-end has often been postulated, there has nevertheless existed the problem of successfully fabricating the composite array such that the smaller chips that make up the longer array are in precise and exact alignment, with the chip ends in close abutting relation with one another so that loss or distortion of image data is avoided.

In the prior art, U.S. Pat. Nos., 4,523,102; 4,388,128; and 4,661,191 to Kazufumi et al, Ogawa et al, and Kamio et al, respectively, disclose processes for bonding color filters to image sensor chips in which a heat activated-ultraviolet curable adhesive is used to bond the color filters to the chip. In these prior art processes, the adhesive is first cured partially by exposing the adhesive to ultraviolet light, with curing completed through the application of heat. These prior art processes are enabled by virtue of the transparent nature of the filter, allowing the ultra violet light to pass through the filter and strike the adhesive. A further prior art disclosure, U.S. Pat. No. 4,698,113 to Ogawa, discloses a process for cementing lens elements in which various types of photocurable-heat activated adhesive combinations are provided which are designed to assure curing of the adhesive where impingement of the ultraviolet rays is prevented by dark bands in the color filter.

In contrast, the present invention provides an improved process for fabricating a longer array from a preset number of smaller chips, each chip having one side with at least one row of scanning or printing elements thereon and an opposite side with at least one conductive strip, comprising the steps of: applying at least one bead-like stripe of a substantially transparent photocurable adhesive to one side of a substantially transparent substrate for attaching the chips thereto; placing the preset number of chips in aligned end-to-end abutting relation with one another on the substrate with the one side of the chips against the substrate surface and in contact with the adhesive; exposing the adhesive through the substrate to light to cure the adhesive and bond the chips to the substrate to provide a subassembly composed of the substrate with the preset number of chips attached thereto in end-to-end abutting relation; inverting the subassembly and placing the opposite side of the chips against a conductive substrate having at least one stripe of heat curable conductive adhesive thereon for establishing a bond between the conductive strip on the chips and the substrate; and curing the conductive adhesive to bond the subassembly to the substrate and establish a conductive path between the conductive strip on the chips and the substrate.

Figure 1:
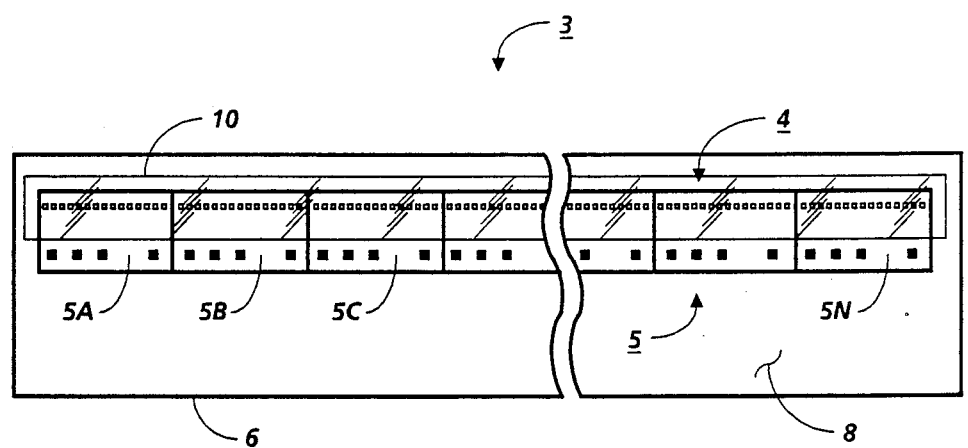
FIG. 1 is an isometric view illustrating a full width array comprised of plural smaller chips assembled in end-to-end relation and bonded together in accordance with the process taught by the present invention.

Referring particularly to FIG. 1 of the drawings, there is shown a long or full width scanning array 3 composed of a subassembly 4 of smaller sensor chips or arrays 5 assembled end-to-end (specific chips are identified by numerals 5A, 5B, . . . 5N) with an elongated rectangular transparent substrate 10, subassembly 4 being in turn assembled with a similarly shaped but somewhat larger base 6. Substrate 10 comprises any suitable transparent material as, for example, glass, it being understood that substrate 10 must be sufficiently transparent to enable passage of light such as UV light therethrough as will appear. Base 6, which may comprise any suitable substrate material such as ceramic or glass, has an electrically conductive metallic covering or coating such as copper on the surface 8 thereof on which subassembly 4 is mounted. As will be understood, metallic coating 8 is substantially opaque and may comprise either a thin film coating (i.e., $\leq 10$ um) or a thick film coating (i.e., approximately 11 umapproximately 50 um).

As will be understood by those skilled in the art, array 3 is typically used to read or scan a document original line by line and convert the document image to electrical signals. Preferably, array 3 is a full width array having an overall length equal to or slightly greater than the width of the largest document to be scanned.

Figure 2:
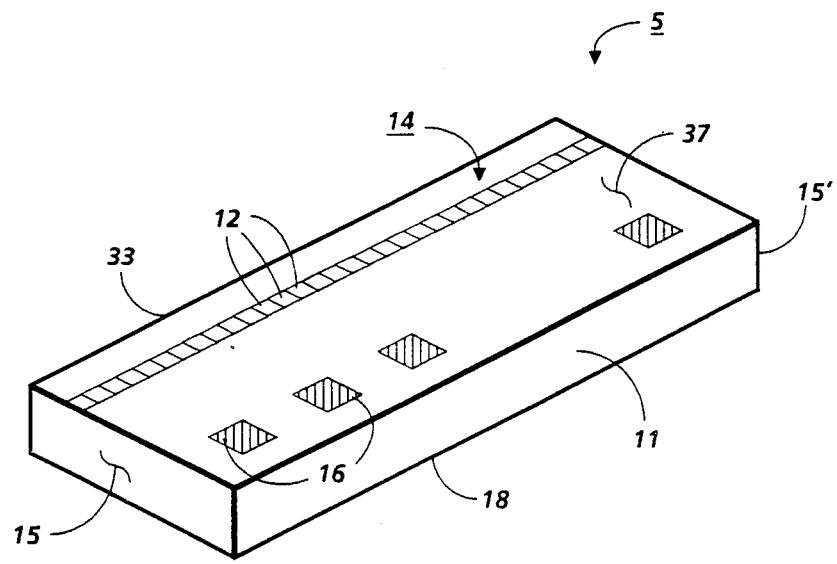
FIG. 2 is a view illustrating a smaller chip of the type used to make the full width array shown in FIG. 1.
Figure 3:
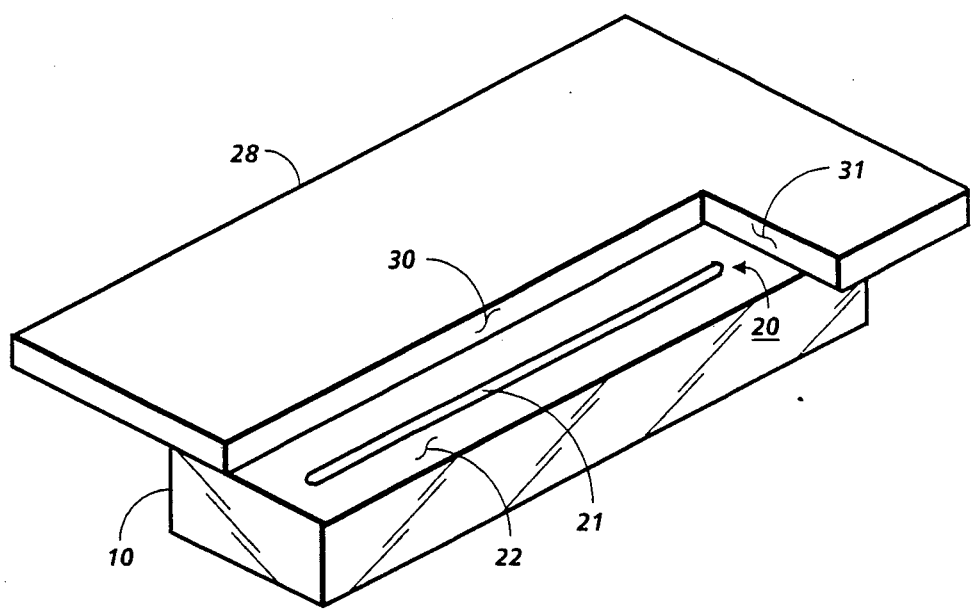
FIG. 3 is a view depicting the first stage of the process of the present invention in which the chips shown in FIG. 2 are placed in aligned end-to-end position on a transparent substrate and bonded thereto using a photocurable adhesive.
Figure 4:
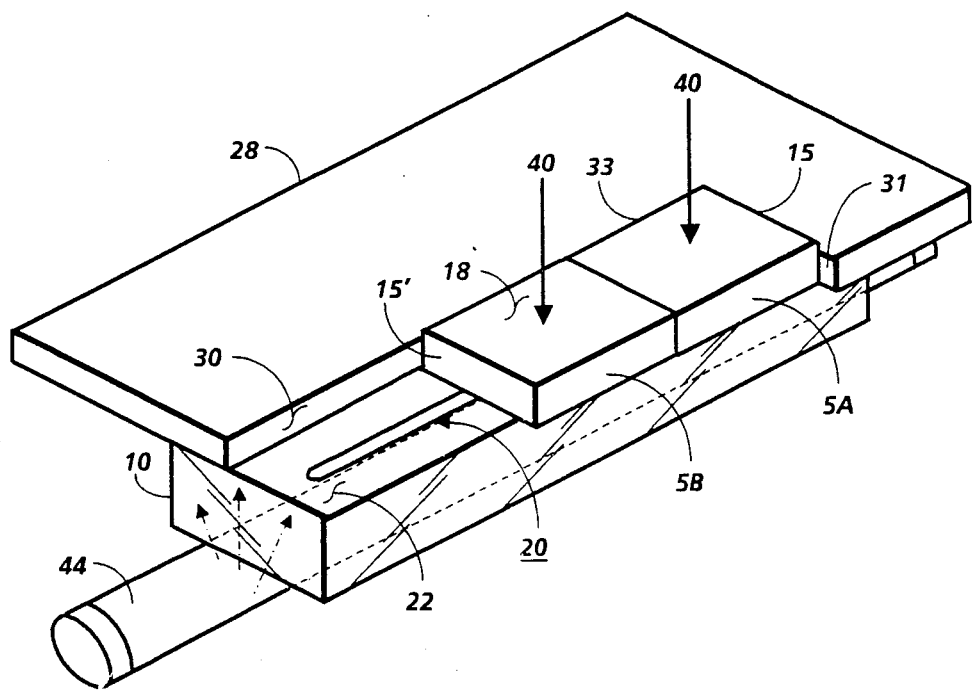
FIG. 4 is a view depicting the second stage in the process of the present invention in which the photocurable adhesive is activated by a ultraviolet (UV) light source to bond the chips to the substrate.
Figure 5:
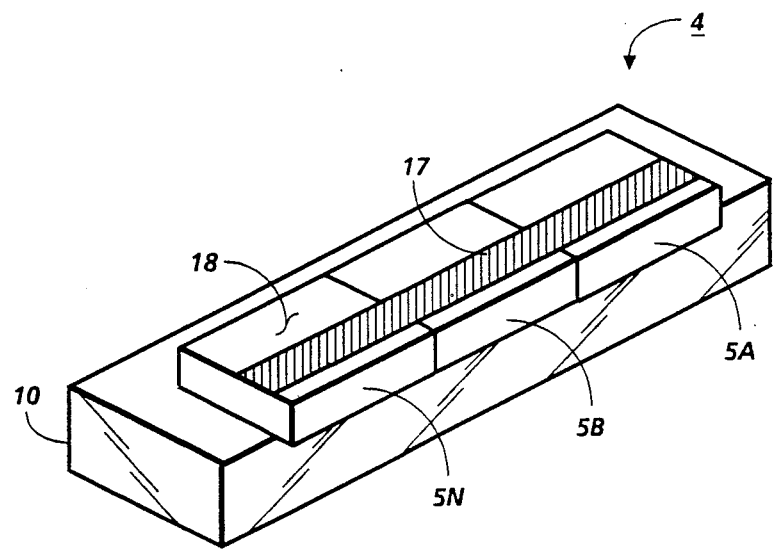
FIG. 5 is a view of the subassembly from FIG. 4 inverted to display the back of the assembled chips and conductor strip.
Figure 6:
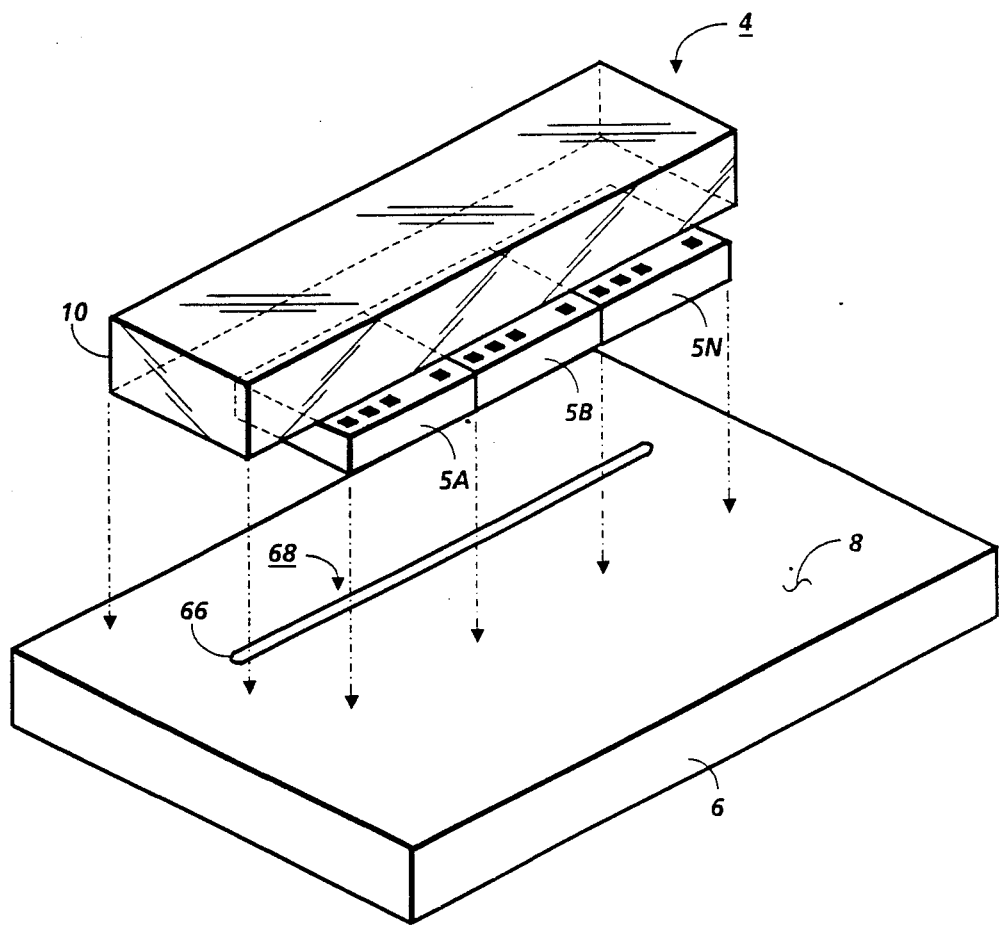
FIG. 6 is a view depicting the third stage in the assembly process of the present invention in which the inverted subassembly is mounted on a conductive second substrate and bonded thereto by a heat activated conductive adhesive.

As shown in FIG. 2, chips 5, which may, for example, be Charge Coupled Devices (CCDs), comprise a relatively thin silicon die 11 having a generally rectangular shape. A row 14 of photosites 12 parallels the longitudinal axis of the chips. While a single row 14 of photosites 12 is shown, plural photosite rows may be contemplated. Other active elements such as shift registers, gates, pixel clock, etc., are preferably formed integral with die 11. Chips 5 have suitable external connectors, shown here as bonding pads 16 and one or more conductors such as copper strips 17 along the bottom 18 thereof (seen in FIG. 5), the latter serving to electrically ground the chips 5. As will be understood, chips 5 are opaque.

Chips 5 are provided with substantially flat, square ends 15, 15' designed to enable chips 5 to be accurately abutted together with one another without distortion or other artifact. Chips suitable for this purpose may, for example, be formed in the manner described in U.S. Pat. No. 4,814,296, issued on Mar. 21, 1989, in the names of Josef E. Jedlicka et al.

When a single chip 5 is used for scanning purposes, the image resolution achieved is a function of the number of photosites 12 that can be fabricated on the chip divided by the width of the scan line. Since the number of photosites 12 that can be packed onto a single chip is limited, it is advantageous to assemble plural chips together in a longer array, and preferably to form a full width or full size array whose scan area is coextensive with the scan line. In the present invention, a plurality of chips 5A, 5B, ... 5N are secured in abutting end-to-end relation to form a continuous and uninterrupted row of photosites with a substantially uniform periodicity.

Referring now to FIGS. 3-6, in the process of the present invention, a bead 20 of a suitable photocurable adhesive 21, which is sufficiently transparent to light for curing and scanning purposes, is laid down on the surface 22 of substrate 10. Since adhesive 21 is transparent, the adhesive will not interfere with or disturb the optical properties of the photosites 12. The size and amount of adhesive 21 in bead 20 is controlled to prevent the adhesive, on placement of chips 5 on substrate 10, from squeezing or oozing outwardly toward the aligning fixture 28 which is used to locate and align the chips 5 on substrate 10.

During the fabrication process, substrate 10 is held in fixed position by a suitable retainer (not shown), substrate 10 being held in place so that the transparency of substrate 10 opposite adhesive bead 20 is not interfered with or blocked. To assist in locating and registering chips 5 in position on surface 22 of substrate 10, aligning fixture 28 having registration edges 30, 31 is used. Registration edges 30, 31 of fixture 28 cooperate to form an L-shaped registration guide, substrate 10 and fixture 28 being positioned relative to one another such that engagement of registration edge 30 with one side 33 of the chips 5 locates and aligns the chips axially, while engagement of end 15 of the first chip 5A with registration edge 31 locates the chips with respect to the ends of substrate 10.

During fabrication, chips 5 are placed face down on the surface 22 of substrate 10 with the end 15 and side 33 of the first chip 5A in tight abutting relation with registration edges 30, 31 respectively. A controlled pressure (designated by the arrow 40) is applied to the chip 5A to force the top 37 of chip 5A into tight contact with the surface 22 of substrate 10 and provide controlled leveling and distribution of adhesive 21.

Following placing of the first chip 5A on substrate 10, the next chip 5B is positioned face down on the surface 22 of substrate 10, with the end 15 of chip 5B abutting the free end 15' of chip 5A and the side 33 of chip 5B tightly against registration edge 30. The remaining chips 5 that comprise array 3 are similarly positioned on substrate 10 until the last chip 5N that comprises the array 3 is set in place.

Following placing of the last chip 5N on substrate 10, the adhesive 21 is exposed through transparent substrate 10 to a suitable source of UV light 44 to cure the adhesive 21 and establish a permanent bond between the chips 5 and the substrate 10. UV light 44 may, for example, comprise a UV lamp or scanning UV laser. Where it is desired instead to cure adhesive 21 as each chip 5 is positioned on substrate 10, a focused UV laser may be used.

Following bonding of chips 5 to substrate 10, the subassembly 4 is removed from aligning fixture 28, inverted, and placed in predetermined registered position on base 6 with the bottom 18 of the assembled chips 5A-5N resting on surface 8 of the base. For this purpose, a bead 66 of suitable heat activated conductive adhesive 68, which may, for example, be an epoxy type adhesive, is previously deposited on surface 8 of base 6, the adhesive bead 66 being aligned with and positioned opposite to the conductive strip or strips 17 on the back 18 of the assembled chips. A suitable gripping device (not shown) is used to bring the subassembly 4 into exact positional relationship with base 6 and hold the parts in contact while the adhesive 68 is activated. Activation of adhesive 68 may be done as by heating the assembly in an oven (not shown).

While formation of a scanning array 3 has been shown and described, the process of the present invention may be employed to form long or full width printer arrays using a series of smaller ink jet heads, ionographic heads, etc. which have one or more rows of printing elements.

While the invention has been described with reference to the structure disclosed, it is not confined to the details set forth, but is intended to cover such modifications or changes as may come within the scope of the following claims.

I claim:

1. A method of fabricating a longer array from a plurality of discrete chips, each chip having one side with at least one row of scanning or printing elements thereon and an opposite side with at least one conductive strip, comprising the steps of:
   (a) applying at least one bead-like stripe of a transparent photocurable adhesive to one side of a transparent substrate for attaching said chips thereto;
   (b) placing said plurality of chips in aligned end-to-end abutting relation with one another on said substrate with said one side of said chips against said substrate surface and in contact with said adhesive;
   (c) exposing said adhesive through said substrate to light to cure said adhesive and bond said chips to said substrate to provide a subassembly composed of said substrate with said plurality of chips attached thereto in end-to-end abutting relation;

(d) inverting said subassembly and placing the opposite side of said chips against a conductive substrate having at least one stripe of heat curable conductive adhesive thereon for establishing a bond between the conductive strip on said chips and said substrate; and (e) curing said conductive adhesive to bond said subassembly to said substrate and establish a conductive path between the conductive strip on said chips and said substrate.

2. The method according to claim 1 including the step of:

placing said chips on said substrate against a temporary registration edge to locate said chips in aligned end-to-end abutting relation with one another.

3. A process for forming a large array of scanning or printing elements by assembling a plurality of discrete scanning or printing chips in aligned abutting end-to-end relation with one another, one side of said chips having at least one row of scanning or printing elements and an adjacent free area for bonding use, comprising the steps of:

(a) applying at least one substantially continuous stripe of a substantially transparent photocurable adhesive to a substantially transparent first substrate;

(b) placing said one side of said chips against said substrate in aligned and abutting end-to-end relation, with said chips in contact with said photocurable adhesive stripe;

(c) exposing said photocurable adhesive through said transparent substrate to actinic radiation to cure said photocurable adhesive and bond said chips to said substrate to provide an array subassembly;

(d) placing the opposite side of said chips of said subassembly against a second substrate having at least one stripe of heat activated adhesive; and (e) activating said adhesive to bond said subassembly to said second substrate and form said array.

4. The process according to claim 3 in which each of said chips has at least one exposed conductor on the opposite side of said chips, including the steps of:

(a) providing a conductive surface on said second substrate prior to engagement with said chips;

(b) said stripe of heat activated adhesive being electrically conductive; and (c) locating said electrically conductive heat activated adhesive stripe on said second substrate conductive surface so that on placing said subassembly on said second substrate conductive surface, said electrically conductive heat activated adhesive establishes a conductive path between said conductive strips on said chips and said second substrate conductive surface.

* * * * *